(12) United States Patent
Martin et al.

(10) Patent No.: US 6,441,649 B1
(45) Date of Patent: Aug. 27, 2002

(54) RAIL-TO-RAIL INPUT CLOCKED AMPLIFIER

(75) Inventors: Aaron K. Martin, Hillsboro; Stephen R. Mooney, Beaverton; Joseph T. Kennedy, Beaverton; Matthew B. Haycock, Beaverton; Shekhar Y. Borkar, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,647

(22) Filed: Dec. 29, 2000

(51) Int. Cl.[7] .............................................. G01R 19/00
(52) U.S. Cl. ......................................... 327/52; 327/57
(58) Field of Search ............................... 327/51, 52, 53, 327/54, 55, 56, 57, 563; 365/205, 207, 208; 330/252, 253

(56) References Cited

U.S. PATENT DOCUMENTS 5,355,391 A * 10/1994 Horowitz et al. ............ 375/257
5,977,798 A * 11/1999 Zerbe .......................... 326/98
6,147,514 A * 11/2000 Shiratake ..................... 327/55

* cited by examiner

*Primary Examiner*—Matthew Smith
*Assistant Examiner*—Paul Dinh
(74) *Attorney, Agent, or Firm*—Blakely, Sokoloff, Taylor & Zafman LLP

(57) ABSTRACT

The invention provides an apparatus, method and means for capturing data. In an aspect, a differential and complementary input folded-cascode clocked amplifier is provided. In an aspect, the invention provides rail-to-rail input common-mode voltage range. In an aspect, the invention provides a setup/hold time window that is smaller than the setup/hold time window of a conventional clocked amplifier and a conventional input amplifier with a separate amplifier and latch. In an aspect, the invention provides high common-mode rejection as compared with conventional clocked sense amplifiers.

16 Claims, 2 Drawing Sheets

RAIL-TO-RAIL INPUT CLOCKED AMPLIFIER

FIELD

The invention relates to a clocked amplifier, more particularly, a differential and complementary input folded-cascode clocked amplifier having a rail-to-rail input common-mode voltage range, a small setup/hold time window, and high common-mode rejection.

BACKGROUND

Input/output (I/O) interfaces allow the entry of data into a computer and the extraction of data from a computer. Conventional high speed I/O interfaces include a receiving amplifier followed by a latch, the latch triggered by a clock to capture data. These conventional I/O interfaces are limited in their ability to latch data properly in part by their timing margin which is substantially reduced due to jitter of the input amplifier. Jitter, the variation of data with respect to a clock, is caused by noise from a power supply or an adjacently coupled data signal, etc. Input amplifier jitter is minimized by using a clock triggered amplifier in which the output stage of the amplifier itself is latched by the clock, as opposed to using a separate latch. A clock triggered amplifier is also useful in other applications including memory applications, etc.

BRIEF DESCRIPTION OF THE DRAWINGS

Additional advantages of the invention will become apparent upon reading the following detailed description and upon reference to the drawings, in which.

DETAILED DESCRIPTION

Figure 1:
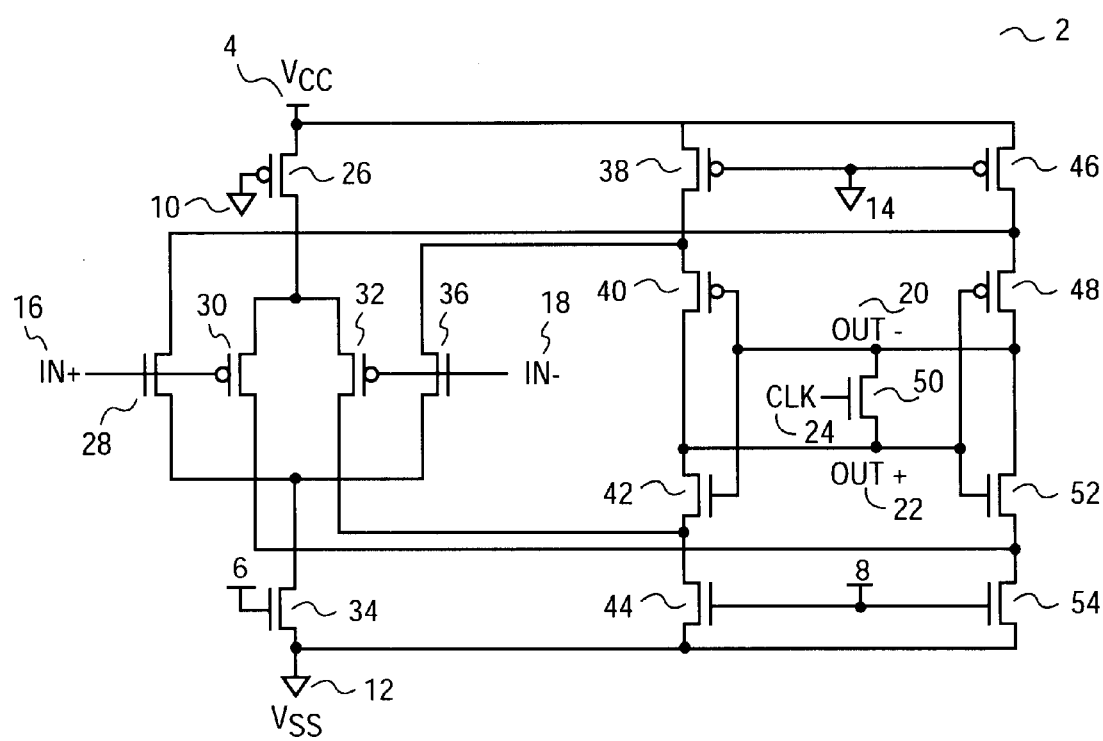
FIG. 1 is a schematic diagram of a differential complementary input clocked amplifier, in an embodiment of the invention.

Exemplary embodiments are described with reference to specific configurations. Those skilled in the art will appreciate that various changes and modifications can be made while remaining within the scope of the claims.

Signaling methods, including simultaneous bi-directional signaling (SBD) would benefit from a clocked amplifier, but require a rail-to-rail input common-mode voltage range, not provided by conventional clocked amplifiers. That is, conventional clocked amplifiers are limited in their input common-mode voltage range since they use a single type of differential input pair, either negative-channel metal-oxide semiconductor (NMOS) or positive-channel metal-oxide semiconductor (PMOS). For example, the conventional clocked amplifier shown in FIG. 3 includes a differential input having NMOS devices.

The invention provides many advantages over conventional techniques. In an embodiment, the invention provides an input amplifier having a clocked complementary folded-cascode amplifier. In an embodiment, the invention overcomes the identified limitations of conventional techniques and provides an apparatus, method and means for rail-to-rail input common-mode voltage range. In an embodiment, the invention provides rail-to-rail input commonmode voltage range by an apparatus, method and means other than using a complementary folded-cascode amplifier. Having a rail-to-rail input commonmode voltage range enables signaling technology including SBD, reduced voltage swing and high speed interface devices including gunning transceiver logic (GTL), etc. Rail-to-rail is defined as an input common mode voltage, ranging from a high supply voltage (Vcc) to a low supply voltage (Vss).

In an embodiment, the invention is compared to a conventional amplifier using 0.18 micron CMOS technology. If Vcc is 1.5 volts and Vss is 0 volts, then an embodiment of the invention provides a common mode input range of 1.5 volts while a conventional amplifier provides a common mode input range of only about 1.1 volts.

Using a clocked input amplifier reduces the timing margin contribution of an input amplifier to the setup/hold time of the input receiver. In an embodiment, the invention provides an apparatus, method and means for a setup/hold time that is smaller than the setup/hold time window of a conventional clocked amplifier and a conventional input amplifier with a separate amplifier and latch. By "smaller" it is meant that an embodiment of the invention and a conventional amplifier are compared, using the same technology, and the invention provides a setup/hold time less than the conventional amplifier. The setup/hold time defined as a necessary time period, from before a clock transition to after a clock transition, for data to be settled for a clock to accurately latch data.

In an embodiment, the invention is compared to a conventional amplifier using 0.18 micron CMOS technology. While the conventional amplifier provides a setup/hold time of about 15 picoseconds, an embodiment of the invention provides a setup/hold time of less than 5 picoseconds.

Figure 3:
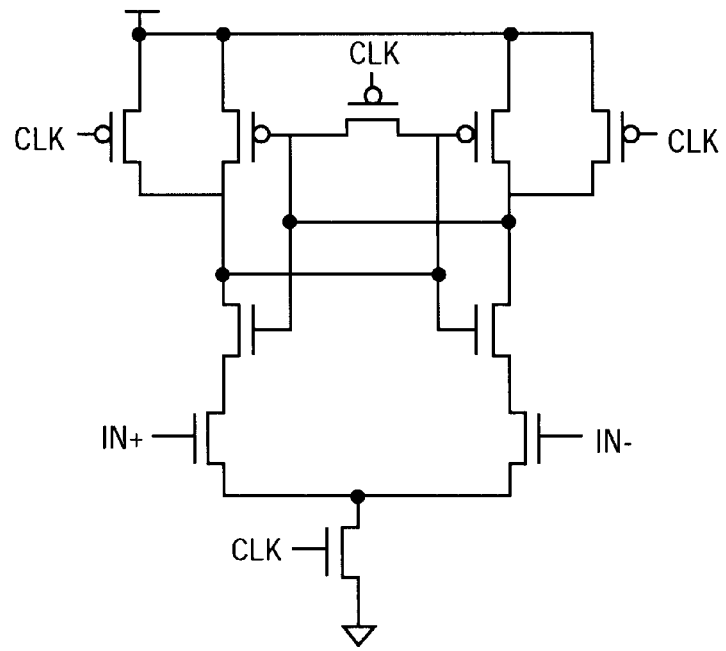
FIG. 3 is a block diagram showing a conventional clocked sense amplifier utilizing a single input differential pair.

In an embodiment, the invention additionally provides an apparatus, method and means for high common-mode rejection as compared to conventional clocked sense amplifiers. By "high" it is meant that an embodiment of the invention and a conventional amplifier are compared, using the same technology, and the invention provides a common-mode rejection higher than the conventional amplifier. Common-mode rejection being the effect of common mode variation of the input on the setup/hold time. As the common mode level of the differential input rises and falls, an embodiment of the invention rejects more of the common mode noise than conventional designs such as a non-complementary sense amplifier as shown in FIG. 3. That is, the differential and complementary input stage provided by the invention compensates for common mode noise.

In an embodiment, the invention is compared to a conventional amplifier using 0.18 micron CMOS technology. While conventional amplifiers show about a 50 picosecond shift in the setup/hold time with 75% supply voltage common mode variation, an embodiment of the invention shows less than a 5 picosecond shift in setup/hold time with rail-to-rail common mode variation.

Figure 2:
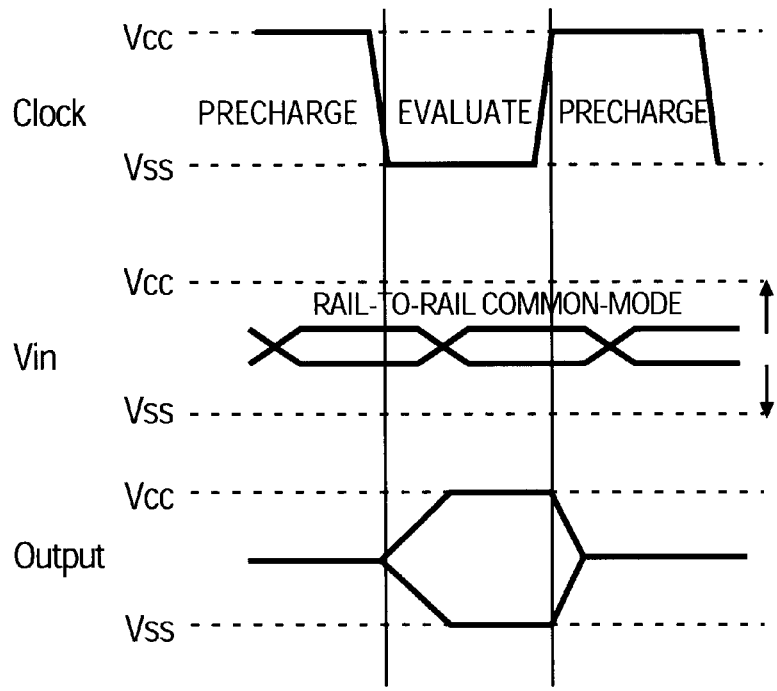
FIG. 2 is a timing waveform diagram illustrating the two phases of the clock, input voltages and output voltages, in an embodiment of the invention.

As shown in FIG. 1, in an embodiment, the invention includes a differential input stage including input 16 and input 18 connected in a complementary design such that a rail-to-rail input common-mode voltage range is provided. Further, as shown in FIG. 2, the crossed lines on the waveform represent the time in which a new data byte becomes valid on the output. Input 16 and input 18 are each connected to both a PMOS device and an NMOS device, input 16 connected to NMOS 28 and PMOS 30, and input 18 connected to NMOS 36 and PMOS 32. Having complementary PMOS and NMOS inputs allows for rail-to-rail common-mode voltage range. In a differential pair, both inputs devices share the same total current. When current is increased to one input device, the result is a corresponding decrease in current to a second input device. For example, NMOS 28 and NMOS 36 make up a differential pair, share the same total current, and as current is increased to NMOS 28 there is a corresponding decrease in current to NMOS 36. As an example, when IN 16 receives an increase in voltage, and IN 18 receives a corresponding decrease in voltage, NMOS 28 being connected with PMOS 48 pulls Out 20 low, and PMOS 30 being connected with NMOS 52 pulls Out 20 low. At the same time, NMOS 36 being connected with PMOS 40 pulls Out 22 high, and PMOS 32 being connected with NMOS 42 pulls Out 22 high.

In an embodiment, the invention includes a current source circuit. The current source circuit, biased to the rails, can be identified generally in two groups. Group one includes Vcc 4, Vss 10, PMOS 26, Vss 14, PMOS 38 and PMOS 46. Group two includes Vcc 6, Vss 12, NMOS 34, Vcc 8, NMOS 44 and NMOS 54. The current source provides a current bias to devices connected to input 16, input 18, output 20 and output 22. In an embodiment, Vcc 4, Vcc 6 and Vcc 8 provide the same voltage. In an embodiment, the current source circuit includes an input for receiving a high supply voltage and an input for receiving a low supply voltage. In an embodiment, the current source circuit includes an input for receiving a high supply voltage and an input for receiving a low supply voltage, and does not include Vcc 4, Vcc 6, Vcc 8, Vss 12, Vss 10 and Vss 14. In an embodiment, the current source circuit includes an input for receiving a high supply voltage and an input for receiving a low supply voltage, and does not include Vcc 4, Vcc 6, Vcc 8, Vss 12, Vss 10 and Vss 14, such that an additional bias circuit provides a bias voltage, and therefore an embodiment of the invention maintains a constant current across process, voltage and temperature variations. In an embodiment, the current source circuit is biased to a predetermined voltage.

In an embodiment, the invention provides an output stage having clock input 24 controlling the conductivity of NMOS 50. The output stage can be identified generally as clock input 24, output 20, output 22, NMOS 50, PMOS 40, PMOS 48, NMOS 42, and NMOS 52. In an embodiment, NMOS 50 is substituted for a PMOS device or an NMOS and a PMOS device connected in parallel. When examined at a "high-level", the output stage can be considered as two inverters connected in positive feedback. The input of one inverter is cross coupled to the output of another inverter, and vice-versa. In conventional designs, the gates of PMOS devices are connected across to each other. A single device pre-charges these two inverters to a precharge level, the outputs being shorted together and making the outputs insensitive to the inputs during precharge.

The output stage also includes an evaluate phase. As shown in FIG. 2, the precharge and the evaluate phase are prompted by clock input 24. The precharge phase starts when NMOS 50 is turned on by clock input 24. After some time, the output settles to about one-half of Vcc, with about zero differential gain when comparing input 16 and input 18 against output 20 and output 22. The evaluate phase starts when NMOS 50 is turned off by clock input 24. The differential voltage from input 16 to input 18, at clock input 24 transition from precharge to evaluate creates a differential current in the output, which forces the latch into a particular state until the next precharge phase. The positive feedback of the cross-coupled inverters in the output stage make the outputs insensitive to the inputs, after the output has latched, during the evaluate phase.

In an embodiment, a system is provided. The system includes a memory, an I/O port, and a microprocessor. The memory, I/O port, and microprocessor are I/O connected by a memory bus, data bus and control bus. The microprocessor includes an apparatus having an input circuit to receive a first input and a second input, and provide rail-to-rail input common-mode voltage range. The apparatus also includes an output circuit having a clock input and a precharge circuit, to provide a first output and a second output. The apparatus further includes a current source circuit connected with the input circuit and the output circuit, and biased to a predetermined voltage. The input circuit includes a complementary arrangement. The output circuit, having a precharge phase and an evaluate phase, and starting the phases as prompted by the clock input, latches data upon detecting the first input and the second input being differential during the evaluate phase. In an embodiment, the input circuit, the output circuit and the current source circuit are connected in a folded cascode arrangement. In an embodiment, the current source circuit is biased to rails. In an embodiment, the complementary arrangement provides a small setup/hold time. In an embodiment, the complementary arrangement provides high common-mode rejection. In an embodiment, the precharge circuit is a short circuit. In an embodiment, the first input is connected with at least one PMOS device and at least one NMOS device, and the second input is connected with at least one PMOS device and at least one NMOS device. In an embodiment, the output circuit includes two inverters connected in positive feedback.

In an embodiment, the clocked amplifier is used in systems having differential data captured by a clock, including a microprocessor, chipset, dynamic random access memory (DRAM) interface, static random access memory (SRAM), logic units, other I/O circuits, etc.

Having disclosed exemplary embodiments, modifications and variations may be made to the disclosed embodiments while remaining within the spirit and scope of the invention as defined by the appended claims.

What is claimed is:

1. A circuit comprising:
   a first differential transistor pair having an input coupled to a transmission line signal input;
   a second differential transistor pair being of a complementary type to the first differential pair and having an input coupled to the transmission line signal input;
   a first cascode amplifier having an input coupled to an output of the first differential transistor pair;
   a second cascode amplifier being of a complementary type to the first cascode amplifier and having an input coupled to an output of the second differential transistor pair; and
   a switching circuit coupled to equalize outputs of the first and second cascode amplifiers.

2. The circuit of claim 1 further comprising:
   a first bias circuit coupled to a power return node to sink a tail current of the first differential pair; and
   a second bias circuit coupled to a power supply node to source a tail current of the second differential pair.

3. The circuit of claim 2 wherein the first and second bias circuits include first and second field effect transistors (FETs) whose gate electrodes are coupled to the power supply and return nodes, respectively.

4. The circuit of claim 3 wherein the first cascode amplifier includes third and fourth FETs, the second cascode amplifier includes fifth and sixth FETs being of a complementary type to the third and fourth FETs, the third and fifth FETs are coupled to form a first inverter, and the fourth and sixth FETs are coupled to form a second inverter.

5. The circuit of claim 3 wherein the switching circuit includes a FET whose source and drain electrodes are coupled to the outputs of the first and second cascode amplifiers and whose gate electrode is coupled to receive a control signal.

6. The circuit of claim 4 wherein the first and second inverters are cross-coupled to form a latch.

7. The circuit of claim 1 further comprising:
   a first field effect transistor (FET) coupled to a power return node to sink a tail current of the first differential pair; and
   a second FET coupled to a power supply node to source a tail current of the second differential pair.

8. The circuit of claim 7 wherein the first cascode amplifier includes third and fourth FETs, the second cascode amplifier includes fifth and sixth FETs being of a complementary type to the third and fourth FETs, the third and fifth FETs are coupled to form a first inverter, and the fourth and sixth FETs are coupled to form a second inverter.

9. The circuit of claim 8 wherein the first and second inverters are cross-coupled to form a latch.

10. A method comprising:
   coupling a transmission line signal to an input of a first differential amplifier and to an input of a second differential amplifier, the second differential amplifier being of a complementary type to the first differential amplifier; and
   coupling a control signal to a switching circuit to repeatedly equalize and release first and second outputs of first and second cascode amplifiers while the transmission line signal is coupled to the inputs of the first and second differential amplifiers, an input of the first cascode amplifier being coupled to an output of the first differential amplifier, and an input of the second cascode amplifier being coupled an output of the second differential amplifier.

11. The method of claim 10 wherein the transmission line signal is used in a simultaneous bidirectional signaling scheme.

12. A method comprising:
   differentially driving a pair of first nodes in response to a transmission line signal;
   differentially driving a pair of second nodes, which are separate from the pair of first nodes, in response to the transmission line signal; and
   repeatedly equalizing and releasing a pair of third nodes, and driving one of the third nodes while released using a pair of cascode amplifiers and driving another one of the third nodes while released using another pair of cascode amplifiers in response to signals at the pairs of first and second nodes.

13. The method of claim 12 further comprising:
   driving the pair of third nodes, while released, to one of only two stable conditions that represent different magnitudes of the transmission line signal, in response to the signals at the pairs of first and second nodes.

14. A system comprising:
   a processor having an I/O interface to a bus, the I/O interface includes a first differential transistor pair whose input is coupled to receive a bus signal, a second differential transistor pair being of a complementary type to the first differential pair and whose input is coupled to receive the bus signal, a first cascode amplifier having an input coupled to an output of the first differential transistor pair, a second cascode amplifier being of a complementary type to the first cascode amplifier and having an input coupled to an output of the second differential transistor pair, and a switching circuit coupled to equalize outputs of the first and second cascode amplifiers.

15. A system comprising:
   a dynamic random access memory (DRAM) device having an I/O interface to a bus, the I/O interface includes a first differential transistor pair whose input is coupled to receive a bus signal, a second differential transistor pair being of a complementary type to the first differential pair and whose input is coupled to receive the bus signal, a first cascode amplifier having an input coupled to an output of the first differential transistor pair, a second cascode amplifier being of a complementary type to the first cascode amplifier and having an input coupled to an output of the second differential transistor pair, and a switching circuit coupled to equalize outputs of the first and second cascode amplifiers.

16. A system comprising:
   a computer system chipset having an I/O interface to a bus, the I/O interface includes a first differential transistor pair whose input is coupled to receive a bus signal, a second differential transistor pair being of a complementary type to the first differential pair and whose input is coupled to receive the bus signal, a first cascode amplifier having an input coupled to an output of the first differential transistor pair, a second cascode amplifier being of a complementary type to the first cascode amplifier and having an input coupled to an output of the second differential transistor pair, and a switching circuit coupled to equalize outputs of the first and second cascode amplifiers.

* * * * *